United States Patent [19]

Maddox

[11] 4,050,013
[45] Sept. 20, 1977

[54] MAGNETIC FIELD PROBE WHICH MEASURES SWITCHING CURRENT OF MAGNETIC ELEMENT AT MOMENT THE ELEMENT SWITCHES AS MEASURE OF EXTERNAL FIELD

[75] Inventor: Harry L. Maddox, Reynoldsburg, Ohio

[73] Assignee: Western Electric Company, Incorporated, New York, N.Y.

[21] Appl. No.: 661,218

[22] Filed: Feb. 25, 1976

[51] Int. Cl.² .......................................... G01R 33/02
[52] U.S. Cl. ............................... 324/43 R; 324/117 R
[58] Field of Search ................... 324/43 R, 47, 117 R

[56] References Cited

U.S. PATENT DOCUMENTS

| 2,743,416 | 4/1956 | Kelly, Jr. | 324/43 R |
|---|---|---|---|
| 3,541,432 | 11/1970 | Scarbrough | 324/43 R |
| 3,812,428 | 5/1974 | Trenkler | 324/43 R |

FOREIGN PATENT DOCUMENTS

| 4,531,825 | 11/1966 | Japan | 324/43 R |
|---|---|---|---|
| 995,307 | 6/1965 | United Kingdom | 324/43 R |
| 119,600 | 1/1958 | U.S.S.R. | 324/43 R |

*Primary Examiner*—Robert J. Corcoran
*Attorney, Agent, or Firm*—K. R. Bergum; R. P. Miller

[57] ABSTRACT

A probe for sensing the strength of the magnetic field that surrounds a current-carrying conductor has a square-loop magnetic material wrapped about a conductor which is placed in the magnetic field to be sensed. An alternating signal is applied to the conductor, of sufficient intensity to cause successive reversals of the polarity of the magnetic material. A sense winding around the magnetic material issues a switch signal every time the magnetic material reverses polarity. The switch signal is used to sample the alternating drive signal current in order to store the amplitude of the drive signal at the instant at which the magnetic material reverses polarity. The sampled signal amplitude is averaged over a period of time, and the resultant amplitude is a linear function of the strength of the magnetic field. A second conductor, magnetic material and sense winding are arranged in a position remote from the magnetic field in order to sense the effect of the Earth's magnetic field. The averaged output signal resulting from the measurement of the Earth's magnetic field is then subtracted from the averaged output signal derived from the measurement of the magnetic field that surrounds the current-carrying conductor. The difference signal is displayed as an indication of the current-produced magnetic intensity or the magnitude of the electric current which produces it.

12 Claims, 4 Drawing Figures

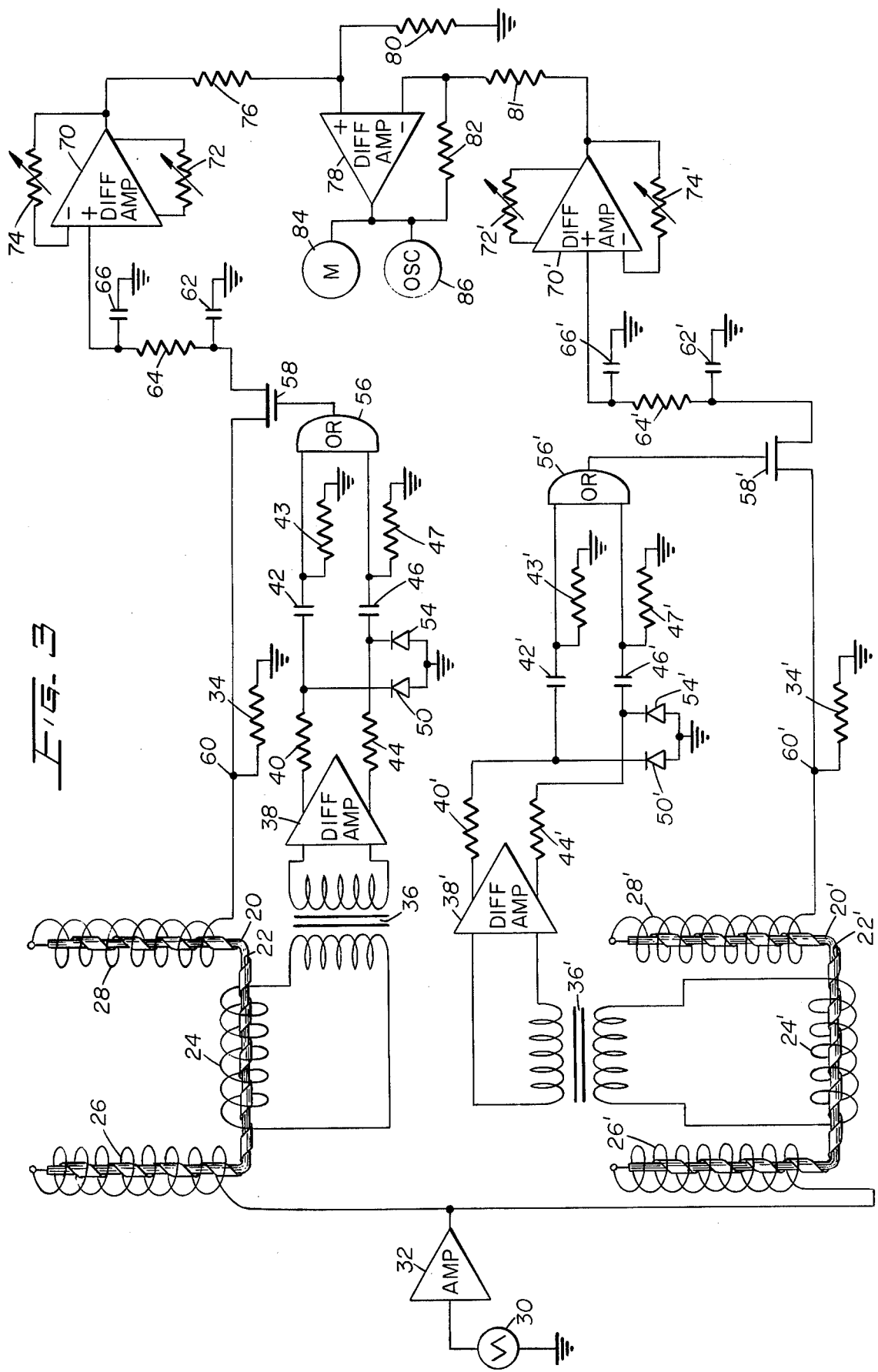

MAGNETIC FIELD PROBE WHICH MEASURES SWITCHING CURRENT OF MAGNETIC ELEMENT AT MOMENT THE ELEMENT SWITCHES AS MEASURE OF EXTERNAL FIELD

FIELD OF THE INVENTION

The present invention relates to magnetic field sensing.

BACKGROUND OF THE INVENTION

It has long been known that when an electric current flows in a wire it generates a magnetic field about that wire. The magnetomotive force generated by the current in the wire can be strong enough to reverse the magnetic polarity of a retentive magnetic material placed within the magnetic influence of that magnetomotive force. When the retentive material changes polarity, it induces a voltage pulse in the wire, as well as in a second sense wire if placed within the magnetic influence of the magnetic material. Such a voltage pulse can be used to indicate that the magnetic material has changed polarity. This is the technique used to interrogate the intelligence stored in toroidal ferrite cores used in the memories of digital computers.

When an external magnetomotive force field, as from a magnetic recording tape or the Earth's magnetic field is to be sensed, a magnetically permeable material, whether retentive or not, is brought within that magnetic field. The magnetic field can magnetically saturate the material or at least distort the symmetry of its response to the magnetomotive force generated by an alternating current in an associated drive wire, sometimes called an excitation winding. If the magnetic material saturates, a sense wire or winding associated therewith will note a sharp reduction in the transformer coupling that otherwise exists from the excitation winding, through the magnetic material, and to the sense winding. The excitation winding and the sense winding correspond to the primary and secondary windings, respectively, of a transformer.

When the external magnetic field only distorts the symmetry of the response of the magnetic material, the output voltage from the sense winding contains an increased proportion of even-numbered harmonics of the excitation alternating-current signal impressed on the excitation winding. Saturable reactors, magnetometers, and transformer-like structures of all types have long been known and used for magnetic field sensing.

U.S. Pat. No. 3,521,261 granted on July 21, 1970, to J. L. Metz is one example of such a magnetic sensor. The prior art is filled with physical arrangements of a magnetic material and its primary and secondary windings. Two examples of such prior art are shown in U.S. Pat. Nos. 2,916,696 granted on Dec. 8, 1959, and 3,439,264 granted on Apr. 15, 1969, both to E. O. Schoenstedt. These two patents show a very thin "Permalloy" strip wrapped about one or more conductors and in turn surrounded by a sense winding.

The prior-art magnetic sensing devices are limited since they use intrinsic, quantitative characteristics of the magnetic material, such as coercive force or saturation flux density, to sense the presence or magnitude of a magnetic field. Therefore, these prior-art sensing devices lack absolute accuracy and linearity, in the quantitative sense, in the measurement of a magnetic field or the electric current that develops it.

SUMMARY OF THE INVENTION

In accordance with the present invention, an energizing coil switches a square-loop magnetic material in the presence of a magnetic field, and a sensing coil senses the change of polarity of the magnetic material. The output of the sensing coil is used to sample the amplitude of the driving current. The sampled driving signal current is averaged over time, which results in a voltage level that is a linear representation of the magnitude of the magnetic field being sensed.

BRIEF DESCRIPTION OF THE DRAWINGS

A more complete understanding of the present invention may be had by referring to the following detailed description when considered in conjunction with the accompanying drawings wherein like reference numbers refer to the same or similar parts throughout the several views:

FIG. 3 is a schematic circuit diagram of a system for processing signals in accordance with the present invention in order to determine true magnitude of a magnetic field.

DETAILED DESCRIPTION

Figure 1:
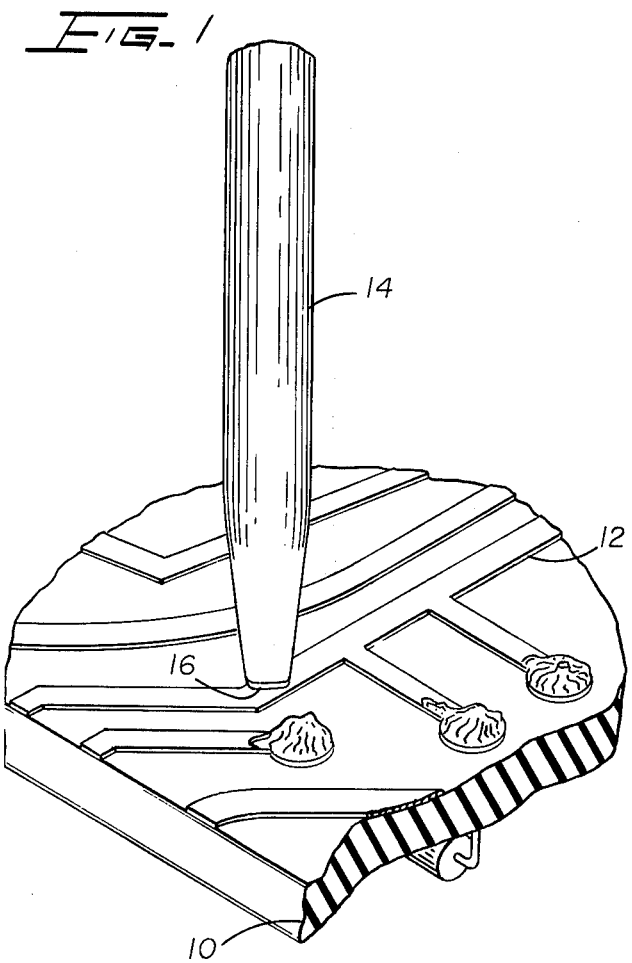
FIG. 1 is a simplified drawing depicting a probe including a sensing coil to show how the present invention would be used to test for current in the conductors of a printed circuit pattern.

Referring now to the accompanying drawings and more particularly to FIG. 1, a printed circuit board 10 is shown generally in isometric view having a conductor 12 formed by printed-wiring techniques on one surface thereof. A pencil-like probe 14 has an electrical insulating tip 16 about 1/32-inch in diameter. The tiny, insulating tip 16 can actually be touched to the printed-wiring conductor 12 without fear of upsetting the operation of the circuit formed on the printed circuit board 10. The tip of the probe 14 contains a sensing coil system behind the insulation 16. In use, the flat insulating tip 16 is preferably placed flat against the conductor 12.

Figure 2:
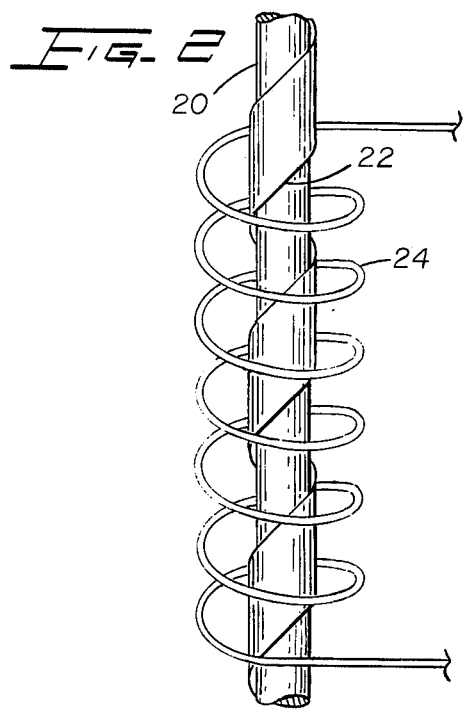
FIG. 2 is a greatly enlarged, detail drawing of a sensing coil magnet system used in the present invention.

Referring now to FIG. 2, there is shown a simplified schematic diagram of a suitable sensing coil based upon the magnetic-ribbon type of computer memory commonly referred to as a "TWISTER." A Twister memory includes a conductive wire 20 which comprises a single-turn conductive coil. A flat ribbon or tape 22 of retentive magnetic material, preferably Permalloy, is wrapped in a 45° helix around the conductor 20. The Permalloy ribbon 22 is formulated and heat treated according to the prior art to exhibit a square hysteresis loop characteristic such that it switches rapidly from one polarization to the opposite polarization as the applied magnetomotive force reaches and exceeds the coercive force. The ribbon 22 is also treated so as to have a preferred magnetization direction along its length.

A sensing coil 24 is wrapped around the ribbon-wrapped wire 20 such that whenever the Permalloy ribbon 22 switches from one polarity to the other, a momentary voltage pulse is induced in the coil 24.

The structure shown in FIG. 2 is mounted in the end of the probe 14 of FIG. 1 just behind the insulating tip 16. An intermediate segment of the wire 20 is preferably oriented perpendicular to the axis of the body of the probe 14.

Figure 4:
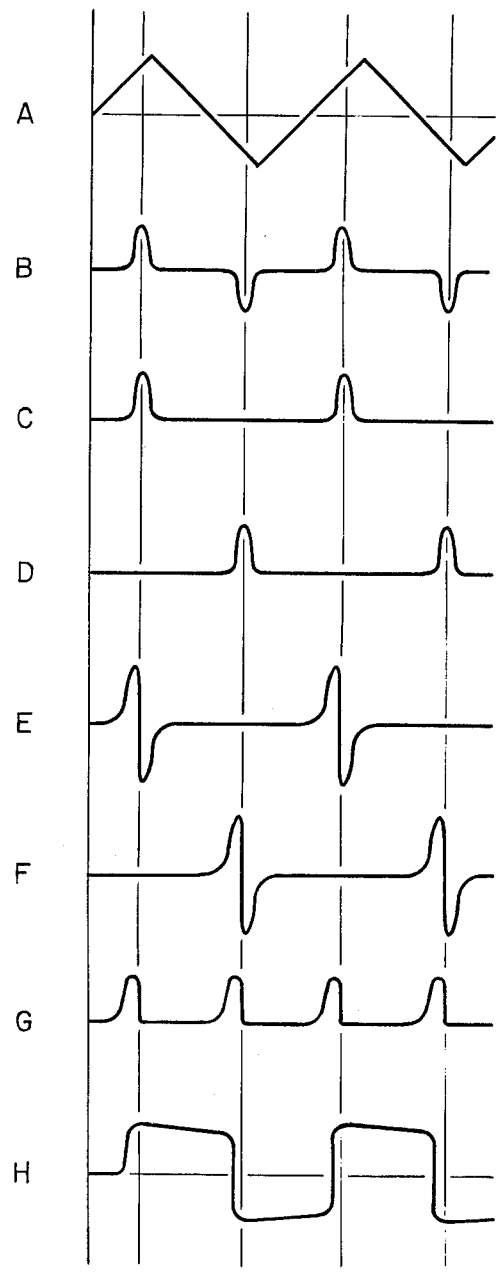
FIG. 4 (on the same sheet as FIG. 1) is a series of waveforms depicting the operation of the circuit of FIG. 3.

Referring now to FIGS. 3 and 4, the wire 20, with the ribbon 22 wrapped around it, is formed with two right-angle bends into the shape illustrated in the upper, left-hand corner of FIG. 3. The Permalloy ribbon 22 is continuous from one end of the wire 20 to the other, even around the right-angle bends. The coil 24 is wrapped about the central portion of the structure comprising the wire 20 and the ribbon 22.

Two prenucleation coils 26 and 28 are wound around the ends of the wire-ribbon structure. One end of each of the coils 26 and 28 is connected directly to its associated end of the wire 20. The coils 26 and 28 are polarized in such a way that when an increasing current flows through the coil 26, the wire 20, and the coil 28, the two portions of the ribbon 22 that underlie the coils 26 and 28 undergo a polarity switch before the one portion of the ribbon that underlies the coil 24 undergoes a polarity switch—all three of the magnetic fields of the ribbon 22 are in aiding magnetic polarization.

The purpose of pre-switching the ends of the ribbon 22 is to eliminate magnetic end effects which can cause a small amount of indecision on the part of the magnetic material as it changes polarity. Indecision is manifest as timing jitter of successive polarity changes. The magnitude of the indecision dictates the responsiveness of the measuring system. More jitter requires averaging over a longer time period to obtain accuracy.

In order to drive the coils 26 and 28 and the wire 20, a ramp oscillator 30 generates ramp-type signals as illustrated in waveform A of FIG. 4. The ramp signals are amplified in an amplifier 32 and delivered to the other end of the coil 26. The other end of the coil 28 is connected via a current-sensing resistor 34 to ground. While ramp signals are preferred, sinusoidal signals, or any other signals without undesirable step changes in current, can be used.

Referring again to waveform A of FIG. 2, as the current increases through the coils 26 and 28 as well as through the wire 20, the Permalloy ribbon 22 switches polarity at its ends inside the coils 26 and 28. As the current through the wire 20 continues to increase, a point is reached at which the Permalloy ribbon 22 within the sensing coil 24 also changes or switches polarity. The polarity change or reversal of the portion of the Permalloy ribbon 22 within the coil 24 generates a voltage pulse in the coil 24, which is illustrated in waveform B of FIG. 4. This voltage pulse is coupled via a step-up transformer 36 to a differential amplifier 38.

The differential amplifier 38 produces two conjugate outputs, one identical to the input pulses of waveform B and one the inverse of the input pulses. The normal or uninverted pulses pass through a current-limiting resistor 40 to a differentiating capacitor-resistor network 42,43. Similarly, the inverted output from the differential amplifier 38 passes through a current-limiting resistor 44 to another differentiating capacitor-resistor network 46,47.

Pulses of negative polarity are dropped across the current-limiting resistor 40 and are shunted to ground by a shunt diode 50. The diode 50 prevents the negative pulses from having any effect on the capacitor 42. However, pulses of a positive polarity as shown in waveform C of FIG. 4 produce a voltage across the resistor 43 of the differentiating capacitor-resistor circuit 42,43 as shown in waveform E of FIG. 4.

Similarly, a positive pulse passing through the current-limiting resistor 44 (see waveform D of FIG. 4) is differentiated by the capacitor-resistor circuit 46,47. Negative pulses passing through the current-limiting resistor 44 are shunted to ground by a diode 54. The differentiated, inverted signal at the junction of the capacitor 46 and the resistor 47 is depicted in waveform F of FIG. 4.

To minimize losses in the pulses depicted in waveforms C and D of FIG. 4, the resistance of each of the resistors 40 and 44 should be low with respect to the values of the resistors 43 and 47.

The two voltage signals depicted in the waveforms E and F and issuing from the two R-C differentiating circuits 42,43 and 46,47 are delivered to an OR-gate 56. The OR-gate 56 ignores the negative portions of the differentiated pulses applied to it. The output of the OR-gate 56 is depicted in waveform G of FIG. 4.

The output of the OR-gate 56 is delivered to the gate terminal of an insulated-gate field-effect transistor 58. Each positive pulse depicted in waveform G of FIG. 4 turns ON the field-effect transistor 58. When a field-effect transistor is in its OFF condition, a very high impedance exists between its controlled terminals—commonly referred to by the polarity-dependent designations "source" and "drain." However, when the field-effect transistor is in the ON condition, a very low impedance exists between its controlled terminals. When a field-effect transistor is ON, it can conduct current in either direction between its controlled electrodes.

The voltage appearing across the current-sensing resistor 34 is proportional to the current flowing through the wire 20 at any given instant. When the field-effect transistor 58 turns ON, it conducts current in either direction between the ungrounded end 60 of the current-sensing resistor 34 and a capacitor 62 of an averaging circuit or low-pass filter comprised of a resistor 64 and a capacitor 66. The ON duration of the field effect transistor 58 is determined by the R-C time constants of the capacitors 42 and 46 with their associated resistors 43 and 47. This ON duration is sufficiently long to allow the capacitor 62 to charge to the voltage present across the current-sensing resistor 34. An example of a typical voltage pattern across the capacitor 62 is depicted in waveform H of FIG. 4. The voltage across the capacitor 62 is filtered through a relatively long time constant of the resistor 64 and the capacitor 66.

The purpose of the field-effect transistor 58 is to sample the level of the current through the wire 20 and assure that the capacitor 62 is storing a voltage exactly proportional to the magnitude of that current at the instant that the Permalloy ribbon 22 changes polarity. Therefore, the pulses depicted in the waveforms C and D are differentiated to produce the waveforms E and F. The differentiated pulses have a sharp drop from the positive polarity pulse to and beyond zero exactly at the center of the polarity reversal of the Permalloy ribbon 22. Waveform G shows that the field-effect transistor 58 turns OFF at exactly the instant of that peak flux change and isolates, on the capacitor 62, the instantaneous voltage level that represents the magnitude of the energizing current that was needed to reverse the polarity of the Permalloy ribbon 22.

The voltage at the filter capacitor 66 represents the average or mean of the magnitudes of the levels of current at each instant of magnetic polarity reversal. This average-representing voltage is thus proportional to the difference between the current required in the wire 20 to produce a magnetic change in the ribbon 22 to one polarity and the current required in the wire 20 to produce a magnetic change in the ribbon to the opposite polarity. The difference between the current required to change to one polarity and the current required to change to the opposite polarity is directly and linearly proportional to the strength of the magnetic field surrounding the Permalloy ribbon 22. Therefore, the voltage across the capacitor 66 is linearly proportional to the strength of the magnetic field around the Permalloy ribbon 22. Since only differences in drive current magnitude survive the averaging process of the resistor 64 and the capacitor 66, the magnitude of the magnetic parameters, such as coercive force, of the material of the ribbon 22 are not reflected in the average voltage across the capacitor 66.

Referring again to the waveform H of FIG. 4, if the area under the positive polarity portions of waveform H exactly equals the area under the negative polarity portions of that waveform, the voltage across the capacitor 66 is zero. However, if the area under the positive polarity portions of waveform H is larger than the area under the negative portions of waveform H, a positive voltage will appear across the capacitor 66. The voltage across the capacitor 66 is delivered to the normal or non-inverting input of a final differential amplifier 70. The differential amplifier 70 has a zero adjusting variable resistor 72 which is used to null miscellaneous d.c. voltage offsets due to characteristic variations of the components.

A variable resistance 74 operates in a feedback loop and is connected from the output of the differential amplifier 70 back to its inverting input. The purpose of this resistor 74 is to adjust the gain of the amplifier 70 so as to calibrate the system to achieve a direct, linear measurement of the magnetic field being sensed or the current level in a given conductor which produces that magnetic field. In the case of a flat, printed conductor, the tip 16 of the probe 14 can be positioned near the center of that conductor and deliver an output calibrated directly in amperes. For a thicker conductor with the probe farther from the center of the conductor, different feedback resistance can be used to compensate for conductor cross-section geometry.

The output from the differential amplifier 70 can be used directly to drive a meter or an oscilloscope in order to sense, in a direct reading, the magnitude of the magnetic field and, thus, the magnitude of the current which produces that magnetic field in the conductor 12 of FIG. 1.

If the Permalloy ribbon 22 is placed in a magnetic field under test, that has flux lines extending substantially in the direction of the wire 20, these flux lines of the tested field and the magnetomotive force that they represent along the Permalloy ribbon 22 vectorially add to the magnetomotive force generated by the current through the wire 20 which produces flux lines perpendicular to the flux lines of the field under test. Therefore, when the polarity of the magnetic field surrounding the wire 20 vectorially adds to the polarity of the magnetic field being tested or sensed, the Permalloy ribbon 22 switches polarity at a lower value of current through the wire 20. Conversely, if the magnetic field due to the current flowing in the wire 20 vectorially opposes the magnetic field being sensed, the two magnetic fields will partially cancel one another; and a higher level of current is necessary in the wire 20 before the Permalloy ribbon 22 changes polarity.

Since the Permalloy ribbon 22 is treated so as to have a preferred magnetic direction along its length and is wound in a 45° helix about the wire 20, the vectorial sum of the orthogonal fields produces magnetization changes along the length of the ribbon 22 in a 45° helix about the wire 20.

It will be readily appreciated that the probe 14 senses and is influences by the Earth's magnetic field as well as the local magnetic field around the conductor 12. In order to eliminate any errors which might arise from the influence of the Earth's magnetic field, another, identical sensor is mounted remote from the insulating tip 16 and well out of the influence of the magnetic field surrounding the conductor 12.

This sensor comprises a wire 20', a ribbon 22', a sensing coil 24' as well as two prenucleation coils 26' and 28'. The output of a sensing coil 24' is coupled by a step-up transformer 36' to a differential amplifier 38'. The pulses passing through two current-limiting resistors 40' and 44' are clipped by two shunting diodes 50' and 54' so that only positive pulses are differentiated by a capacitor 42' and a resistor 43' or a capacitor 46' and resistor 47'. The positive portions of the differentiated pulses pass through an OR-gate 56', momentarily to turn ON a field-effect transistor 58'.

The voltage generated across a current-sensing resistor 34', at its ungrounded end 60', is gated through the field-effect transistor 58' to charge a capacitor 62'. The output of an integrating circuit comprising a resistor 64' and a capacitor 66' is delivered to the normal or non-inverting input of a differential amplifier 70' having a zero adjust resistor 72' and a gain adjust resistor 74' which is used to adjust the gain of the amplifier 70' and thus null the effect of the Earth's magnetic field.

In order to subtract the influence of the Earth's and other ambient magnetic fields that are present in the measurement at the output of the differential amplifier 70' from the output of the differential amplifier 70, the amplifiers 70 and 70' must be counter-phased. That is, the outputs of the differential amplifiers 70 and 70' are connected in such a way that if a rising voltage at the output of the R-C integrator 64,66 produces a positive output from the differential amplifier 70, a rising voltage from the output of the R-C integrator 64', 66' must produce an output from the differential amplifier 70' that subtracts from the output of the differential amplifier 70. The counter-phasing of the differential amplifiers 70 and 70' is shown schematically in FIG. 3 with the output of the differential amplifier 70 connected through a resistor 76 to the normal or non-inverting input of a differential amplifier 78. The normal input of the differential amplifier 78 is also connected through a resistor 80 to ground. The resistors 76 and 80 form a voltage-divider network. The output of the differential amplifier 70' is connected through a resistor 81 to the inverting input of the differential amplifier 78. The output of the differential amplifier 78 is also connected through a feedback resistor 82 to the inverting input of the differential amplifier 78. The feedback resistor 82 is required to fix the gain of the differential amplifier 78. The resistor 81 is needed to prevent the low output impedance of the amplifier 70' from nullifying the effect of the feedback resistor 82. The resistors 81 and 82 together form a voltage divider. The voltage divider of the resistors 76 and 80 is needed merely to balance the effect of the voltage divider of the resistors 81 and 82.

The output of the differential amplifier 78 drives an operator interface, such as either a meter 84 or an oscilloscope 86. In this way, the reading at the meter 84 or the trace visible on the oscilloscope 86 is uninfluenced by the Earth's magnetic field, inasmuch as the effect of the Earth's magnetic field in the output of the differential amplifier 70 is diminished by the effect of that same field in the output of the differential amplifier 70'.

Although a particular embodiment of the invention is shown in the drawings and has been described in the foregoing specification, it is to be understood that other modifications of this invention, varied to fit particular operating conditions will be apparent to those skilled in the art; and the invention is not to be considered limited to the embodiment chosen for purposes of disclosure, and covers all changes and modifications which do not constitute departures from the true scope of the invention.

What is claimed is:

1. A method of indicating the intensity of a sensed magnetic field, wherein square hysteresis loop magnetic material is normally subjected to a magnetic field generated by applying an alternating voltage wave across a pair of coils, characterized by:
   sensing when each of first and second portions of the magnetic material switches its magnetic state in response to the magnetic field generated by a respectively associated one of the coils;
   measuring, with the first portion of the magnetic material and one of said coils, both exterior of a sensed magnetic field, the intensity of which is to be indicated, the value of the current through said one exterior coil when the first portion of magnetic material switches state;
   measuring, with the second portion of the magnetic material and the other of said coils, both within the sensed magnetic field, the intensity of which is to be indicated, the value of the current through said other coil at the instant when the second portion of magnetic material switches state, and over a period of time substantially shorter than the cycle time of said alternating voltage wave;
   comparing the measured values of current; and
   indicating, in accordance with the difference in the compared values of the current, the intensity of the measured magnetic field.

2. A method of sensing the magnetic field produced by current flowing in a conductor including positioning near the conductor, but electrically insulated therefrom, a first conductive coil, a magnetic material having substantially a square hysteresis loop and positioned within the magnetic influence of the first coil, and a second conductive coil positioned within the magnetic influence of the magnetic material, including the steps of:
   driving the first coil with an alternating signal of sufficient intensity to switch the magnetic material;
   sensing with the second coil the instant at which the magnetic material switches magnetic state;
   sampling the amplitude of the driving signal at the instant when the magnetic material switches magnetic state, and over a period of time substantially shorter than the cycle time of said alternating signal; and
   averaging over time a predetermined succession of the sampled amplitudes to determine the presence of a magnetic field from the conductor tending to shift the magnitude of the driving signal at which the magnetic state of the magnetic material changes.

3. A method according to claim 2 further including the steps of:
   measuring, with a separate portion of magnetic material exterior of the sensed magnetic field, and positioned within the influence of a third coil, the value of the current through the third coil when the portion of magnetic material influenced thereby switches state in response to both the alternating driving signal applied thereto, and any induced current effect of the earth's magnetic field thereon, and
   subtracting the measured value of current in the third coil, including any induced current attributable to the earth's magnetic field, from the averaged sampled signal amplitude.

4. A method according to claim 3 wherein the sensing step includes differentiating the output of the second coil to obtain a maximum voltage change at the instant when the magnetic material switches magnetic state.

5. Apparatus for testing the strength of a magnetic field comprising:
   first conductive coil means;
   a magnetic material element having substantially a square hysteresis loop and located within the magnetic influence of the first conductive coil and the magnetic field under test;
   second conductive coil means located within the magnetic influence of the magnetic material element;
   means for applying an alternating signal to the first conductive coil means, said signal being of sufficient intensity to switch the magnetic material element;
   means for sensing a voltage generated in the second conductive coil means at the instant at which the magnetic material element switches magnetic state;
   means responsive to the sensing means for sampling the alternating signal applied to the first conductive coil means over a period of time substantially shorter than the cycle time of said alternating signal; and
   means for averaging over time a predetermined succession of the sampled portions of the signal applied to the first conductive coil means.

6. Apparatus according to claim 5 further comprising:
   third conductive coil means;
   a second magnetic material element having substantially a square hysteresis loop and located within the magnetic influence of the third conductive coil means but substantially beyond the magnetic influence of the magnetic field under test;
   fourth conductive coil means located within the magnetic influence of the second magnetic material element;
   means for applying an alternating signal to the third conductive coil means, said signal being of sufficient intensity to switch the second magnetic material element;
   means for sensing a voltage generated in the fourth conductive coil means at the instant at which the second magnetic material element switches magnetic state;
   means responsive to the second sensing means for sampling the alternating signal applied to the third conductive coil means;

means for averaging over time a predetermined succession of the sampled portions of the signal applied to the third conductive coil means, and means for subtracting one averaged signal from the other to obtain a difference signal.

7. Apparatus according to claim 5 wherein the sensing means includes means for differentiating the voltage generated in the second conductive coil means to obtain a maximum voltage change at the instant when the magnetic material element switches magnetic state.

8. Apparatus according to claim 7 wherein the sampling means comprises a field-effect transistor having a control terminal and two controlled terminals, the control terminal being connected to the differentiating means, one controlled terminal being connected to the alternating signal, and the other controlled terminal connected to the averaging means.

9. Apparatus according to claim 8 wherein the averaging means comprises:

first storage means for storing a representation of the magnitude of the alternating signal at the instant when the magnetic material element switches magnetic state;

second storage means for storing a selected number of the previously stored signal representations to produce a composite averaged signal magnitude; and means for transferring the stored signal representation from the first storage means to the second storage means at a controlled rate.

10. Apparatus according to claim 5 wherein said first coil means comprises a first portion formed as an elongated single-turn wire-like element that is bent into a substantially U-shaped configuration defined by two leg sections and an intermediate section, a second portion in the form of one helical coil section co-axially positioned along one leg section of said wire-like element, with the outer end of said one leg section and the adjacent end of said one helical coil section being connected, with the opposite end of said one helical coil section being connected to said alternating signal means, and a third portion in the form of an other helical coil section co-axially positioned along the other leg section of said wire-like element, with the outer end of said other leg section and the adjacent end of said other helical coil section being connected, with the opposite end of said other helical coil section being connected to said averaging means.

11. Apparatus according to claim 10 wherein said magnetic material element comprises a thin metallic ribbon helically wound about and extending along said wire-like element of said first conductive coil means, and wherein said second coil means is positioned co-axially of and extends along the intermediate section of said wire-like element.

12. Apparatus according to claim 10 wherein said defined apparatus is supported within an elongated probe housing, with the intermediate section of said wire-like element positioned perpendicular to the axis of said housing at a terminating, insulative wall-defining end thereof, and immediately adjacent the inner surface of said terminating end wall.

* * * * *